United States Patent
Ryu et al.

(10) Patent No.: US 10,409,408 B2
(45) Date of Patent: Sep. 10, 2019

(54) TOUCH SENSITIVE ELEMENT AND DISPLAY DEVICE COMPRISING THE SAME

(71) Applicant: LG DISPLAY CO., LTD., Seoul (KR)

(72) Inventors: Kyungyeol Ryu, Goyang-si (KR); Yong-Su Ham, Seoul (KR); Taeheon Kim, Seoul (KR); YongWoo Lee, Goyang-si (KR); YuSeon Kho, Seoul (KR); MyungJin Lim, Goyang-si (KR); Seulgi Choi, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 86 days.

(21) Appl. No.: 15/824,646

(22) Filed: Nov. 28, 2017

(65) Prior Publication Data

US 2018/0150169 A1    May 31, 2018

(30) Foreign Application Priority Data

Nov. 29, 2016  (KR) .......................... 10-2016-0160812

(51) Int. Cl.

| | |
|---|---|
| *C08L 41/00* | (2006.01) |
| *G06F 3/041* | (2006.01) |
| *H01L 41/18* | (2006.01) |
| *C09D 127/16* | (2006.01) |
| *C08F 20/38* | (2006.01) |
| *H01L 41/113* | (2006.01) |
| *H01L 41/193* | (2006.01) |
| *C08F 220/38* | (2006.01) |

(52) U.S. Cl.
CPC ............ *G06F 3/0412* (2013.01); *C08F 20/38* (2013.01); *C09D 127/16* (2013.01); *H01L 41/1132* (2013.01); *H01L 41/18* (2013.01); *H01L 41/193* (2013.01); *C08F 2220/382* (2013.01)

(58) Field of Classification Search
CPC ....... C09D 127/16; C08L 33/14; C08L 41/00; C08L 27/16
See application file for complete search history.

(56) References Cited

U.S. PATENT DOCUMENTS

| | | | |
|---|---|---|---|
| 8,840,559 B2 | 9/2014 | Morita | |
| 2003/0064267 A1* | 4/2003 | Hedhli | ...................... C08F 8/44 525/191 |
| 2010/0201227 A1 | 8/2010 | Choi et al. | |
| 2012/0248945 A1 | 10/2012 | Koo et al. | |

(Continued)

FOREIGN PATENT DOCUMENTS

KR    2003-0032025    4/2003

OTHER PUBLICATIONS

Fujii et al., "Sulfone-Containing Methacrylate Homopolymers: Wetting and Thermal Properties", Langmuir, vol. 32, 2016 (Published Dec. 30, 2015), pp. 765-771.

(Continued)

*Primary Examiner* — Mark S Kaucher
(74) *Attorney, Agent, or Firm* — Birch, Stewart, Kolasch & Birch, LLP

(57) ABSTRACT

The present disclosure relates to a touch sensitive element and a display device including the same. According to an exemplary embodiment of the present disclosure, the touch sensitive element includes an electroactive film which is formed of a fluorine based terpolymer and a polymer represented by Chemical Formula 1, wherein R is an ethyl group or a methyl group, and n is an integer of 1 or larger.

16 Claims, 9 Drawing Sheets

(56) References Cited

U.S. PATENT DOCUMENTS

2013/0141879 A1    6/2013  Tanaka et al.
2013/0247984 A1*   9/2013  Kim ................... C09D 133/04
                                                        136/259
2013/0264912 A1   10/2013  Kwon et al.

OTHER PUBLICATIONS

Wei et al., "Achieving High Dielectric Constant and Low Loss Properity in a Dipolar Glass Polymer Containing Strongly Dipolar and Small-Sized Sulfone Groups", ACS Appl. Mater. Interfaces, vol. 7, 2015 (Published Feb. 18, 2015), pp. 5248-5257.

* cited by examiner

TOUCH SENSITIVE ELEMENT AND DISPLAY DEVICE COMPRISING THE SAME

CROSS-REFERENCE TO RELATED APPLICATIONS

This application claims the priority benefit of Korean Patent Application No. 10-2016-0160812 filed on Nov. 29, 2016, in the Korean Intellectual Property Office, the disclosure of which is incorporated herein by reference.

BACKGROUND

Field

The present disclosure relates to a touch sensitive element and a display device including the same. More particularly, the present disclosure relates to a touch sensitive element with improved modulus and vibration strength and a display device including the same.

Description of the Related Art

In response to users' demand, a touch type display device, which touches a display device to input information, has been developed and broadly used for various display devices including a liquid crystal display device and an organic light emitting display device. Therefore, research has continued to utilize a haptic device to provide direct and various tactile feedback to the users.

According to the related art, a vibration motor such as an eccentric rotating mass (ERM) or a linear resonant actuator (LRA) is used for the display device as a haptic device. The vibration motor is configured to vibrate the entire display device. However, the vibration motor is not suitable for a flexible display device because of various problems. One problem is that it is difficult to modulate the frequency to adjust the level of vibration because the size of a mass must be increased in order to increase the vibration strength. Another problem is that the response speed of the vibration motor is very slow.

In order to solve the above-described problems, a shape memory alloy (SMA) and electroactive ceramics (EAC) have been developed as materials for the haptic device. However, it is difficult to apply the shape memory alloy and the electroactive ceramics to the display device (e.g., a flexible display device) because the shape memory alloy (SMA) has a slow response speed, a short lifespan, and an opaque property. Also, the electroactive ceramics (EAC) are breakable.

Therefore, haptic devices using an electroactive polymer (EAP) have recently attracted attention. The electroactive polymer is a polymer which may be deformed by an electrical stimulation and may repeatedly expand, contract and bend due to an electrical stimulation. Among various types of electroactive polymers, a ferroelectric polymer and a dielectric elastomer are mainly used. For example, the ferroelectric polymer includes a poly vinylidene fluoride (PVDF), and the dielectric elastomer includes a silicon-based polymer, a urethane-based polymer, an acrylic-based polymer, and the like.

However, PVDF, which is representative of the ferroelectric polymer, has a relatively excellent modulus. However, the PVDF involves a polling process using a high voltage of 4 KV or higher. As such, PVDF is dangerous due to the process characteristics. The dielectric elastomer has an excellent light transmittance and an optical property, but the permittivity is relatively lower than the ferroelectric polymer. Therefore, it is difficult to use the dielectric elastomer for a display device whose voltage is relatively low, such as a mobile display, because the driving voltage of the dielectric elastomer is high.

Therefore, studies for an electroactive polymer which not only satisfies a process stability, a permittivity, and light transmittance characteristics, but also improves the modulus and the vibration strength of the haptic device are required.

SUMMARY

An object of the present disclosure is to provide a touch sensitive element in which both the modulus and the vibration strength are improved and a display device including the same.

Objects of the present disclosure are not limited to the above-mentioned objects, and other objects, which are not mentioned above, can be clearly understood by those skilled in the art from the following descriptions.

According to an aspect of the present disclosure, a touch sensitive element is provided that includes an electroactive film, which is formed of a fluorine based terpolymer, and a polymer represented by the following Chemical Formula 1.

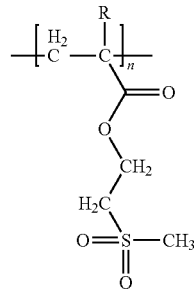

[Chemical Formula 1]

In Chemical Formula 1, R is a methyl group or an ethyl group and n is an integer of 1 or larger.

According to another aspect of the present disclosure, a touch sensitive element is provided, that includes: an electroactive film, which is formed of fluorine based terpolymer, and an acrylate based polymer having a sulfonyl group.

According to yet another aspect of the present disclosure, a display device is provided that includes: a display panel, a touch panel, and a touch sensitive element. The touch sensitive element includes an electroactive film, which is formed of a fluorine based terpolymer, and a polymer represented by the following Chemical Formula 1.

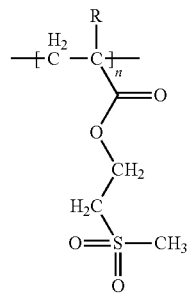

[Chemical Formula 1]

In Chemical Formula 1, R is a methyl group or an ethyl group and n is an integer of 1 or larger.

Other detailed matters of the exemplary embodiments are included in the detailed description and the drawings.

According to the present disclosure, a novel polymer, which has a high dipole moment, a high glass transition temperature Tg, and a high permittivity, is added to configure an electroactive film that has excellent modulus and vibration strength. The addition of the novel polymer provides a touch sensitive element in which both the modulus and the vibration strength are improved.

According to the present disclosure, a display device including a touch sensitive element is provided in which the modulus and the vibration strength are improved. As a result, a tactile perception effect of the display device is improved.

The effects according to the present disclosure are not limited to the contents exemplified above, and other various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
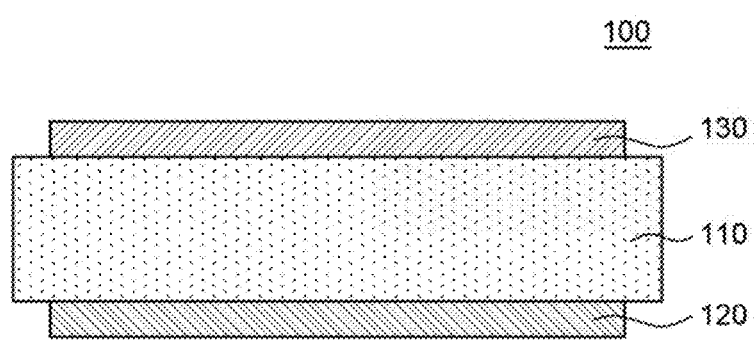
FIG. 1 is a schematic cross-sectional view of a touch sensitive element according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein, but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including" and "having" used herein are generally intended to allow other components to be added, unless the terms are used with the term "only". Any references to singular may include plural, unless expressly stated otherwise.

Components are interpreted to include an ordinary error range even if not expressly stated.

When the position relation between two parts is described using the terms such as "on", "above", "below", and "next", one or more parts may be positioned between the two parts, unless the terms are used with the term "immediately" or "directly".

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from other components. Therefore, a first component mentioned below may be a second component according to an embodiment of the present disclosure.

Like reference numerals generally denote like elements throughout the specification.

The size and thickness of each component illustrated in the drawings are illustrated for convenience of description. The present disclosure is not limited to the size and the thickness of the components illustrated.

The features of various embodiments of the present disclosure can be partially or entirely combined with each other and can be interlocked and operated in technically various ways as understood by those skilled in the art. The embodiments can be carried out independently or in association with each other.

Hereinafter, various exemplary embodiments of the present disclosure will be described in detail with reference to accompanying drawings.

Figure 2:
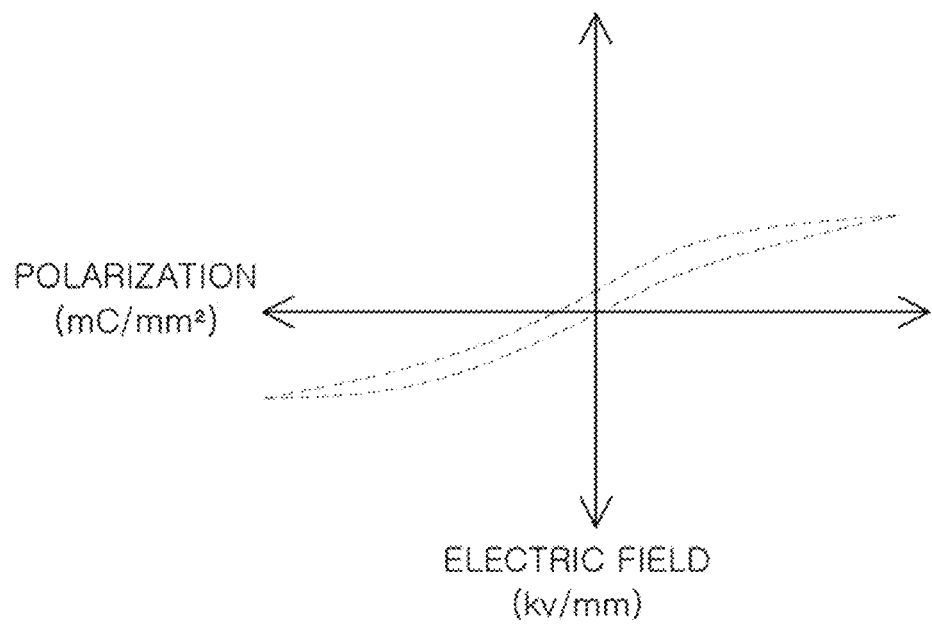
FIG. 2 is a graph illustrating a polarization behavior according to an electric field of PVDF-TrFE-CTFE polymer used for an electroactive film according to an embodiment of the present disclosure.

FIG. 1 is a schematic cross-sectional view of a touch sensitive element according to an exemplary embodiment of the present disclosure. FIG. 2 is a graph illustrating a polarization behavior according to an electric field of PVDF-TrFE-CTFE polymer used for an electroactive film of the present disclosure.

Referring to FIG. 1, the touch sensitive element 100 according to an exemplary embodiment of the present disclosure includes an electroactive film 110, a first electrode 120 disposed below the electroactive film 110, and a second electrode 130 disposed on the electroactive film 110.

The electroactive film 110 is interposed between the first electrode 120 and the second electrode 130 to cause vibration or bending by an electrical stimulation.

The electroactive film 110 according to the exemplary embodiment is formed of a fluorine-based terpolymer and a polymer represented by the following chemical formula 1:

[Chemical formula 1]

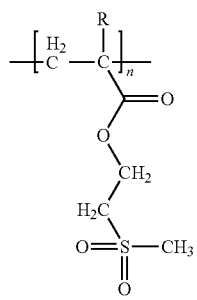

wherein R is a methyl group or an ethyl group, and n is an integer of 1 or larger.

Specifically, the fluorine based terpolymer is a fluorine based polymer formed of three kinds of monomers and is an electroactive polymer (EAP) in which vibration is generated when a voltage is applied. For example, the fluorine based terpolymer may be a polyvinylidene fluoride (hereinafter, referred to as "PVDF") based terpolymer. The PVDF based terpolymer has a lower modulus than a copolymer, such as PVDF-TfFE, but has a high permittivity (high-k) and does not involve a dangerous poling process, which is performed at a high voltage. The poling process is a process of applying a high DC voltage to the polymer for arranging atoms having a specific charge in one direction.

For example, the PVDF based terpolymer may use polyvinylidene fluoride-trifluoroethylene-chlorotrifluoroethylene (hereinafter, referred to as 'PVDF-TrFE-CTFE'). PVDF-TrFE-CTFE is a relaxed ferroelectric (relaxor) type which exhibits a polarization behavior according to the electric field illustrated in FIG. 2, and has a modulus characteristic in the range of 0.04 GPa to 0.15 GPa.

Specifically, the polymer represented by Chemical Formula 1 is a novel acrylate based polymer which may secure compatibility when it is mixed with the fluorine based terpolymer. Also, the polymer represented by Chemical Formula 1 is glassy and has a polarization yield that is 57% to 67%. Further, the polymer represented by Chemical Formula 1 has a glass transition temperature (Tg) that is 185° C. to 195° C. The above-mentioned characteristics are inherent to the material of the polymer represented by Chemical Formula 1. The numerical values are obtained after consideration of a by-product added to the polymer.

According to havriliak-Negami theory, the polymer represented by Chemical Formula 1 may be uniaxially arranged in accordance with the change of the applied frequency due to a high dipole moment (4.25 Debye) of a sulfonyl group (—SO$_2$—), so that chain rotation occurs.

That is, the polymer represented by Chemical Formula 1 uses an arrangement and relaxation of a carbon chain having a high dipole moment so that the permittivity is improved. Thus, a high permittivity (high-k) characteristic is achieved.

In Chemical Formula 1, R is an ethyl group or a methyl group. However, R is not necessarily limited thereto. When the chain of carbon is longer, the glass transition temperature Tg is excessively increased. Therefore, R in Chemical Formula 1 is desirably a methyl group or an ethyl group.

In this case, the polymer represented by Chemical Formula 1 may be polymethylsulfonylethylmethacrylate (PMSEEA) represented by the following Chemical Formula 2 or polymethylsulfonylethylmethacrylate (PMSEMA) represented by the following Chemical Formula 3.

[Chemical Formula 2]

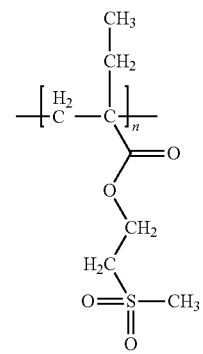

In Chemical Formula 2, n is an integer of 1 or larger

[Chemical Formula 3]

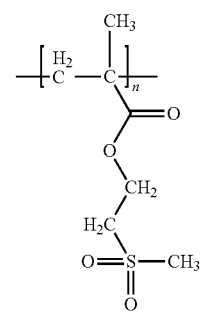

In Chemical Formula 3, n is an integer of 1 or larger.

The polymer represented by Chemical Formula 1 may be used as an additive to improve the modulus and the vibration strength of the electroactive film 110.

Generally, in the touch sensitive element, a vibration feeling which may be recognized by a human being is reduced by a pressing force. Therefore, in order to improve the vibration strength, a blocking force, which is a force to resist the pressing force, must be increased. In order to improve the weight resistance, the modulus needs to be increased. As represented in the following Equations 1 and 2, the weight resistance is proportional to the strength and the modulus of the material. However, the strength of the following Equation 1 is equal to Young's modulus ($k_A$=Y).

<Strength of Material ($k_A$)>

$$k_A = \frac{F\mathrm{max}}{\Delta L_0}$$

[Equation 1]

(Here, $k_A$ is a strength of the material, $F_{max}$ is a maximum resisting force (maximum weight resistance) of the piezoelectric actuator when a load is applied, and $\Delta L_0$ is an initial displacement).

<Weight Resistance (F)>

$$F = N\left(\frac{S}{L}\right) Y d_{33} V \quad \text{[Equation 2]}$$

(Here, F is a weight resistance, N is a number of laminated actuators, S is a cross-section of the actuator, L is a length of the actuator, Y is Young's modulus, $d_{33}$ is a piezoelectric constant, and V is an applied voltage).

According to Equation 2, since the weight resistance is proportional to the modulus and the piezoelectric constant, both the modulus and the piezoelectric constant must be increased to improve the weight resistance. However, as represented in the following Equation 3, the piezoelectric constant is proportional to the polarization and the permittivity.

<Piezoelectric Constant ($d_{33}$)>

$$d_{33} \propto 2\varepsilon P \quad \text{[Equation 3]}$$

(Here, $d_{33}$ is a piezoelectric constant, $\varepsilon$ is a permittivity, and P is polarization.)

Generally, the high dipole moment of the polymer is known to decrease a crystal grain of the polymer and increase the polarization and the modulus.

Therefore, the polarization and the modulus of the electroactive film 110 are simultaneously improved by adding the polymer having a high dipole moment represented by Chemical Formula 1. Also, the permittivity is improved based on the above-described havriliak-Negami theory.

Further, the polymer represented by Chemical Formula 1 includes a sulfonyl group having a high dipole moment so that the glass transition temperature Tg rises to 185° C. or higher. In this case, the rising of the glass transition temperature Tg means the increase of the modulus, so that the modulus of the electroactive film 110 is further improved.

For example, the polymer represented by Chemical Formula 1 may be added in an amount of 7.3 weight % to 10 weight % with respect to the total weight of the electroactive film to improve the modulus. When the added amount of the polymer is less than 7.3 weight % or more than 10 weight %, a characteristic of the fluorine based terpolymer is lost by the polymer having a structure of Chemical Formula 1, so that the effect may be insufficient. Therefore, the polymer represented by Chemical Formula 1 may be added in the above-described range.

A weight average molecular weight of the polymer represented by Chemical Formula 1 is desirably in the range of 500 to 1000 to secure the compatibility at the time of being mixed with the fluorine based terpolymer, but is not necessarily limited thereto.

The modulus of the electroactive film 110 with the above-described configuration is improved. Also, the electroactive film 110 with the above-described configuration results in improvements of the polarization and the permittivity by adding the polymer represented by Chemical Formula 1 having a high dipole moment, a high glass transition temperature Tg, and a high permittivity. Ultimately, the vibration strength may be improved by the improvement of the weight resistance. The electroactive film 110 may satisfy the characteristics of a weight resistance of 0.2 G to 0.6 G at a frequency of 156 Hz, a modulus of 0.6 GPa to 0.8 GPa, a permittivity of 5.0 to 9.0, and a polarization yield of 57% to 67%.

When the weight resistance and the modulus of the electroactive film 110 satisfy the above ranges, the vibration strength and the modulus of the touch sensitive element 100 may be simultaneously improved.

Further, when the permittivity of the electroactive film 110 satisfies the above-described range, the driving voltage of the touch sensitive element 100 may be lowered.

In the above-description, when the weight resistance is less than 0.2 G, the vibration strength may be lowered. In contrast, when the weight resistance exceeds 0.6 G, it is undesirable because the modulus is too high. This results in the electroactive film 110 being hardened which limits the vibration displacement of the polymer represented by Chemical Formula 1. Further, when the modulus is less than 0.6 GPa, the weight resistance may be lowered. In contrast, when the modulus exceeds 0.8 GPa, it is undesirable because the electroactive film 110 is hardened which limits the vibration displacement of the polymer represented by Chemical Formula 1. A characteristic inherent to the material of the polymer represented by Chemical Formula 1, after consideration of a by-product added to the polymer, is the permittivity and the polarization yield of the electroactive film 110.

Further, the electroactive film 110 may satisfy the characteristic of the light transmission of 75% or higher, which will be identified by the following first and second exemplary embodiments. That is, the modulus and the vibration strength of the electroactive film 110 may be improved without significantly lowering the light transmittance.

A composing method of a monomer (ESEMA) of PMSEEA of the present exemplary embodiment is illustrated by the following Reaction Formula 1, and an example of the composing method according to Reaction Formula 1 is as follows.

[Reaction Formula 1]

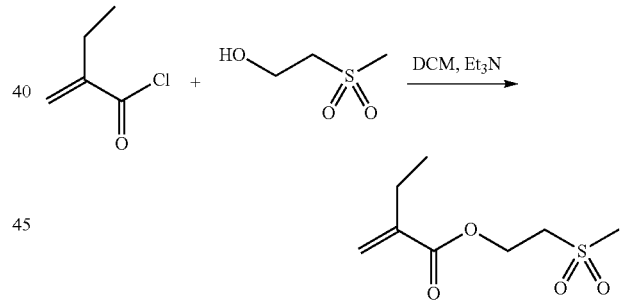

First, 4.52 g (0.036 mol) of 2-(methylsulfonyl)ethanol, ml of dichloromethane (DCM), and 5.12 g (0.056 mol) of triethylamine $Et_3N$ are dropped into a 100 ml three neck flask, and then mixed to produce a mixture. Next, the mixture is stirred for 30 minutes while performing $N_2$ purging at 0° C. or lower. Next, the stirred mixture is slowly dropped to ethacryloyl chloride and the temperature is slowly risen to room temperature (25° C.). Then, a reaction proceeds at room temperature (25° C.) for 24 hours. After the reaction, triethylamine hydrochloride is removed by a filter and a residual solvent is removed by vacuum distillation. Next, the reaction product is re-dissolved in DCM, and then re-precipitated in diethyl ether. This dissolution-re-precipitation is repeated three times. Finally, the produced monomer (ESEMA) is dried for two days in a room temperature vacuum oven.

Figure 3:
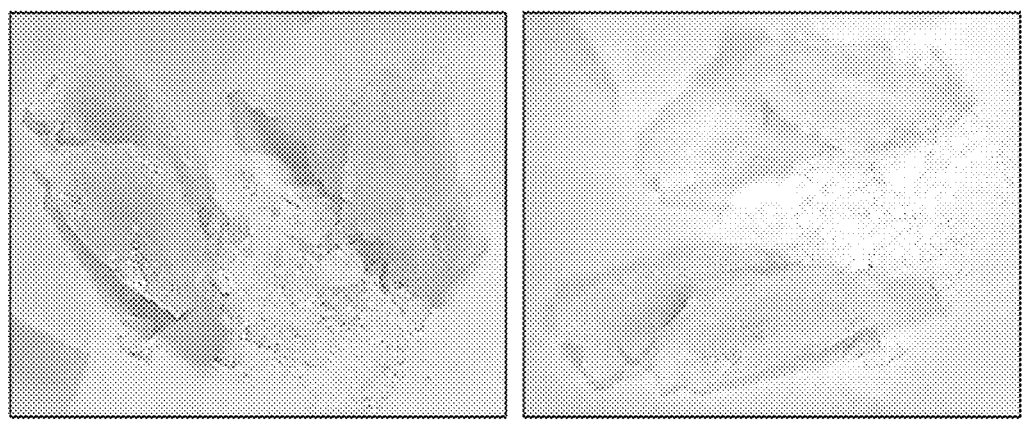
FIG. 3 is a photograph of a scanning electronic microscope (SEM) illustrating an outer appearance of a composed PMSEEA according to another embodiment of the present disclosure.

FIG. 3 is a photograph of a scanning electronic microscope (SEM) illustrating an outer appearance of a composed PMSEEA according an embodiment of the present disclosure. PMSEEA is identified as being opaque, glassy and light yellow.

An example of a manufacturing method of an electroactive film 110 of an exemplary embodiment will be described below. First, a predetermined fluorine based terpolymer, such as a PVDF based terpolymer and a polymer represented by Chemical Formula 1 are placed into a soluble solvent, such as dimethyl sulfoxide (DMSO) or dimethylformamide (DMF), and then mixed to produce a mixture. Thereafter, the mixture is coated on the first electrode 120 using a spin-coating method to form a coating film. Next, the coating film is hardened at a temperature of 50° C. to 100° C. for 5 minutes to 30 minutes, dried at a temperature of 80° C. to 150° C. for 10 minutes to 30 minutes, and then thermally processed at a temperature of 100° C. to 150° C. for 20 minutes to minutes. However, the soluble solvent, the hardening condition, the drying condition, the thermal processing condition, and the coating method are not limited thereto. Any arbitrary appropriate condition known in the art may be employed.

When the polymer represented by Chemical Formula 1 is added to the electroactive film 110, for example, the PMSEEA ($\approx C_8H_{12}O_4S$) is verified by atom analysis, GPEC measurement, and NMR analysis as shown in the following Table 1 and FIGS. 4 and 5.

Table 1 represents a single element analysis result of PMSEEA ($\approx C_8H_{12}O_4S$), which is added to the electroactive film 110, and PMSEEA is extracted from the electroactive film 110 and then solely measured.

TABLE 1

| Measurment Result | | C | H | S | O |
|---|---|---|---|---|---|
| Content (%) | Theoretical Value | 47.059 | 31.37 | 15.69 | 5.88 |
| | Measured Value | 47.23 | 31.28 | 15.71 | 5.78 |

As shown by the element analysis measurement result in Table 1, the measured element may be estimated as PMSEEA ($\approx C_8H_{12}O_4S$) since there is no significant difference between the theoretical value and the measured value of the measured element. Using this measurement, it is possible to confirm that PMSEEA ($\approx C_8H_{12}O_4S$) is added to the electroactive film 110.

Figure 4:
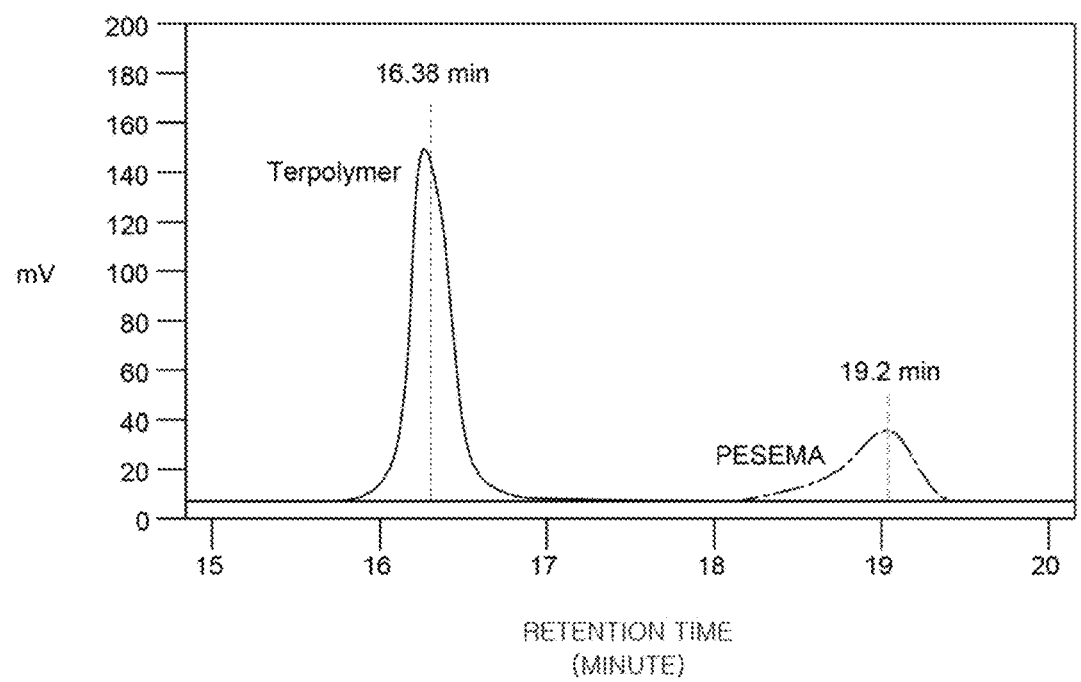
FIG. 4 is a graph illustrating a GPEC measurement result of an electroactive film according to another embodiment of the present disclosure.

FIG. 4 is a graph illustrating a gradient polymer elution chromatography (GPEC) measurement of an electroactive film according to an embodiment of the present disclosure. In this case, the GPEC measurement conditions are as follows.

1) System: Waters Alliance 2690 Separations Module with column heater at 30° C.
2) Detector 1: Waters 996 Photodiode Array Detector
3) Detector 2: Alltech Model 500 ELSD with LTA Adapter (Drift Tube at 40° C., 1.75 Liters/min Nitrogen)
4) Data system: Waters Millennium 32 Chromatography Manager
5) Column: As listed in the drawings, 30° C.
6) Flow Rate: 1 mL/min
7) Samples: Inject 10 µl to 25 µl to 0.2% to 0.5% samples Referring to FIG. 4, the retention time (RT) of the PMSEEA was around the nineteenth minute at the time of the GPEC measurement. At the time of the GPEC measurement, RT indicates an intrinsic polarity of the material. A material whose RT is around the nineteenth minute is PMSEEA. Therefore, it was confirmed that PMSEEA was added to the electroactive film 110 by means of the GPEC measurement.

Figure 5:
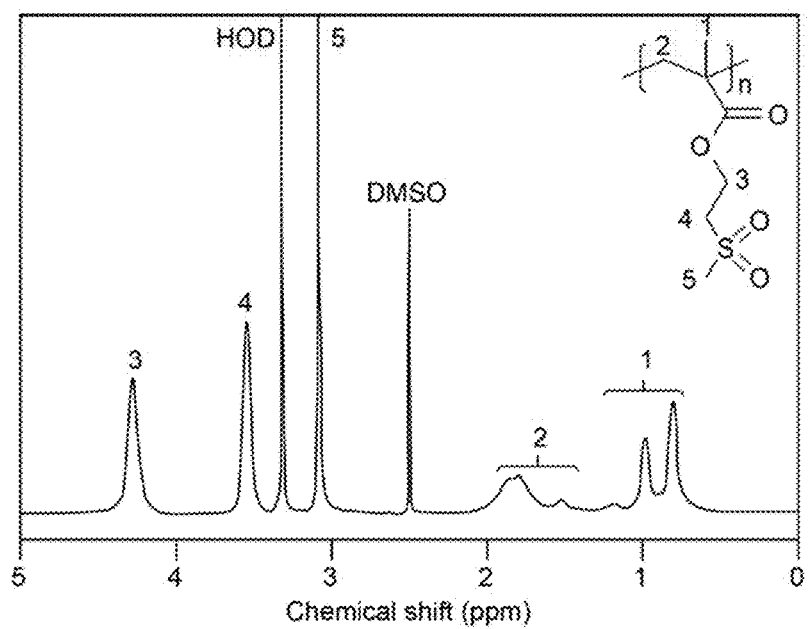
FIG. 5 is a spectrum illustrating a $_1$H-NMR analysis of an electroactive film according to an embodiment of the present disclosure.

FIG. 5 is a spectrum illustrating a $_1$H-NMR (Nuclear Magnetic Resonance) analysis of an electroactive film according to an embodiment of the present disclosure. A specific peak of a specimen was observed under an extracting condition using DMSO-$d_6$ solvent.

Referring to FIG. 1 again, a first electrode 120 and a second electrode 130 are attached on both surfaces of the electroactive film 110 to supply power. The first electrode 120 and the second electrode 130 may be formed of a conductive material, but are not limited thereto. For example, the first electrode 120 and the second electrode 130 may be formed of a metal material, such as gold (Au), copper (Cu), titanium (Ti), chrome (Cr), molybdenum (Mo), aluminum (Al), an aluminum-copper alloy (Al—Cu alloy) or formed of a conductive polymer. Examples of the conductive polymer include PEDOT[Poly(3,4-EthyleneDiOxyThiophene)]:PSS[Poly(4-StyreneSulfonic acid)], polypyrrole, or polyaniline.

Further, the first electrode 120 and the second electrode 130 may be formed of a soft electrode which is manufactured by mixing an elastic body to carbon conductive grease, carbon black or carbon nano tube (CNT), so as to be suitable for smooth repeated driving of the touch sensitive element 100. The first electrode 120 and the second electrode 130 may be formed of the same material or formed of different materials.

When the touch sensitive element 100 of the present disclosure is disposed on the display panel, the first electrode 120 and the second electrode 130 may include a transparent conductive material to secure transparency of the touch sensitive element. However, the first electrode 120 and the second electrode 130 are not limited thereto and the transparent conductive material may be one kind selected from indium tin oxide (ITO), graphene, a metal nano wire, and transparent conductive oxide (TCO).

The first electrode 120 and the second electrode 130 are disposed on both surfaces of the electroactive film 110 by various methods. For example, the first electrode 120 and the second electrode 130 are disposed on both surfaces of the electroactive film 110 by methods such as a sputtering, printing, or slit coating. Specifically, when the first electrode 120 and the second electrode 130 are formed of the same material, the first electrode 120 and the second electrode 130 may be simultaneously disposed.

A voltage is applied to the first electrode 120 and the second electrode 130 from the outside to form an electric field. Here, in order to form an electric field in the electroactive film 110, voltages with different magnitudes or voltages having opposite electrical properties may be applied to the first electrode 120 and the second electrode 130. For example, when a positive voltage is applied to either the first electrode 120 or the second electrode 130, a negative voltage may be applied to the remaining electrode or the remaining electrode may be grounded.

Further, the voltage, which is applied to the first electrode 120 and the second electrode 130, may be an AC voltage or a DC voltage. When the AC voltage is applied to the first electrode 120 and the second electrode 130, the electroactive film 110 may be periodically displaced, so that a vibrating effect may be achieved. When the DC voltage is applied to the first electrode 120 and the second electrode 130, the electroactive film 110 may maintain a bent state.

The touch sensitive element 100 configured as described above uses the electroactive film 110 having excellent permittivity, modulus, and vibration strength by adding a polymer having a high dipole moment, a high Tg, and a high permittivity so that the modulus and the vibration strength may be improved while lowering the driving voltage.

Figure 6:
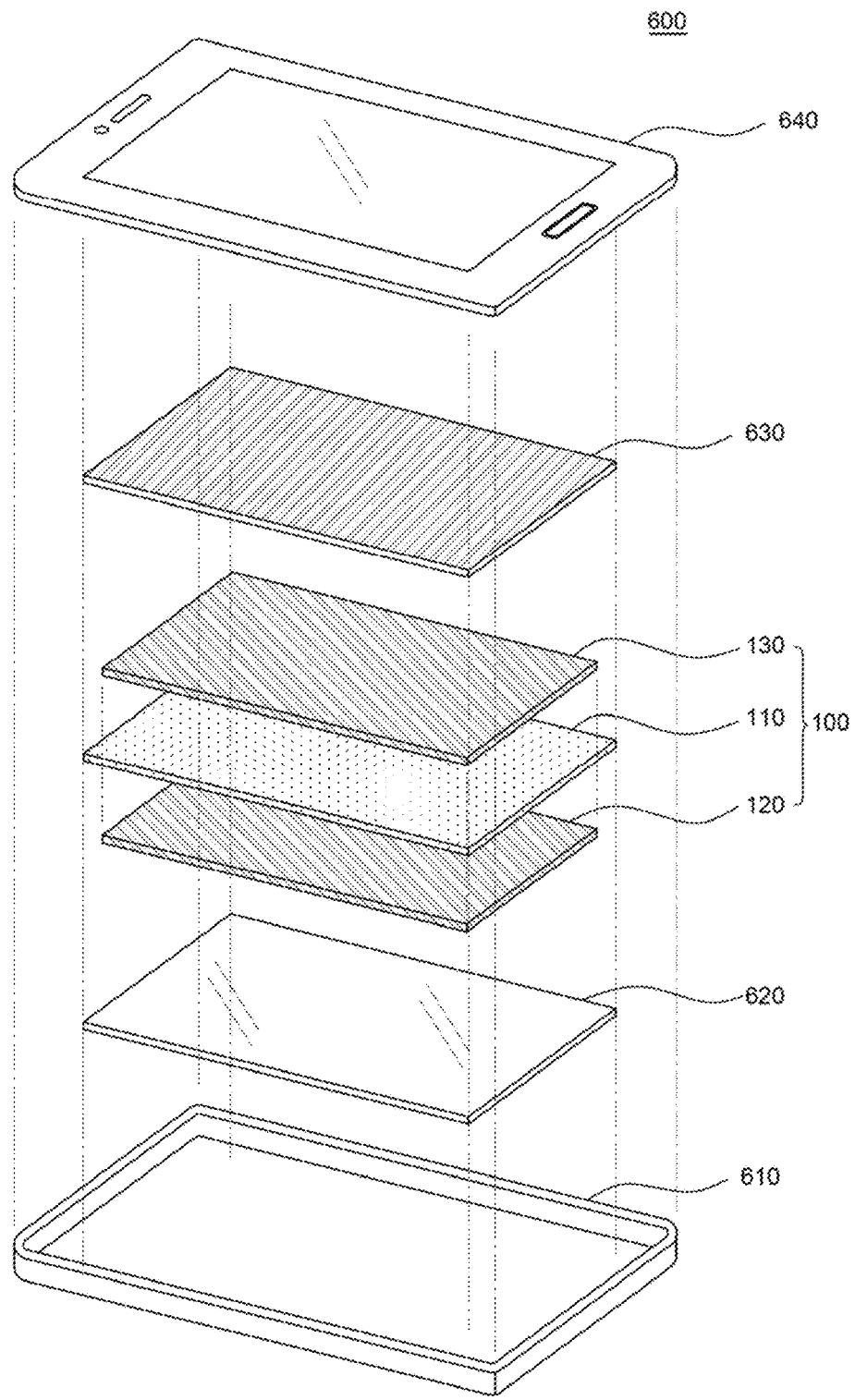
FIG. 6 is a schematic exploded perspective view of a display device including a touch sensitive element according to an exemplary embodiment of the present disclosure.

FIG. 6 is a schematic exploded perspective view of a display device including a touch sensitive element according to an exemplary embodiment of the present disclosure.

Referring to FIG. 6, a display device 600 according to an exemplary embodiment of the present disclosure includes a lower cover 610, a display panel 620, a touch sensitive element 100, a touch panel 630, and an upper cover 640.

The lower cover 610 is disposed below the display panel 620 so as to cover lower portions of the display panel 620, the touch sensitive element 100, and the touch panel 630. The lower cover 610 protects internal components of the display device 600 from external impact or penetration from a foreign substance or moisture. For example, the lower cover 610 may be formed of plastic, which is thermally formed and has a good workability. Alternatively, the lower cover 610 may be formed of a material which may be deformed in accordance with shape deformation of the display device 600, but is not limited thereto.

The display panel 620 refers to a panel in which a display element for displaying an image in the display device 600 is disposed. The display panel 620 may include various display panels, such as an organic light emitting display panel, a liquid crystal display panel, and an electrophoretic display panel. Preferably, the display panel 620 may be an organic light emitting display device. The organic light emitting display device is a display device which flows current to an organic light emitting layer to allow the organic light emitting layer to emit light. The organic light emitting display device emits light having a specific wavelength using the organic light emitting layer. The organic light emitting display device includes at least a cathode, an organic light emitting layer, and an anode.

The organic light emitting display device may be configured to have ductility and deformity. That is, the organic light emitting display device is a flexible organic light emitting display device having ductility and includes a flexible substrate. The flexible organic light emitting display device may be deformed in various directions and angles by force applied from the outside.

The touch sensitive element 100 may be disposed on the display panel 620. The contact sensitive element 100 may be disposed to be in direct contact with an upper surface of the display panel 620, or disposed between an upper surface of the display panel 620 and a lower surface of the touch sensitive element 100 using an adhesive. For example, as the adhesive, an optical clear adhesive (OCA) or an optical clear resin (OCR) may be used, but the adhesive is not limited thereto.

While though the touch sensitive element 100 disposed on the display panel 620 is illustrated in FIG. 6, the touch sensitive element 100 may be disposed below the display panel 620 as needed.

The touch sensitive element 100 illustrated in FIG. 6 includes a first electrode 120, a second electrode 130, and an electroactive film 110. Since the specific components of the touch sensitive element 100 are the same as the touch sensitive element 100 described with reference to FIG. 1, a detailed description will be omitted.

The touch sensitive element 100 may be electrically connected to the display panel 620. For example, a flexible printed circuit board (FPCB) disposed on the display panel 620 and an electrode of the touch sensitive element 100 may be electrically connected to each other by a wiring line.

The touch panel 630 is disposed on the touch sensitive element 100. The touch panel 630 refers to a panel which performs a function of sensing a user's touch input to the display device 600 and providing a touch coordinate.

The touch panel 630 may be classified by an operating method. For example, a capacitive type, a resistive type, an ultrasonic type, an infrared type, or the like may be used. Also, a capacitive type touch panel may be used as the touch panel 630.

Further, the touch panel 630 may be electrically connected to the touch sensitive element 100. Specifically, the touch panel 630 is electrically connected to the electrodes of the touch sensitive element 100 to transmit various touch signals or voltages input from the touch panel 630 to the touch sensitive element 100.

The upper cover 640 is disposed on the touch panel 630 so as to cover upper portions of the touch sensitive element 100, the display panel 620, and the touch panel 630. The upper cover 640 may perform the same function as the lower cover 610. Further, the upper cover 640 is also formed of the same material as the lower cover 610.

The display device 600 configured as described above improves the modulus and the vibration strength of the display device 600 using the electroactive film 110 with improved modulus and vibration strength. This configuration improves a tactile perception effect of the display device 600. The display device 600 may satisfy the following characteristics: a weight resistance of 0.2 G to 0.6 G and a modulus of 0.6 GPa to 0.8 GPa at a frequency of 156 Hz by reflecting the characteristics of the electroactive film 110.

The display device 600 including the touch sensitive element 100 of an exemplary embodiment may be a mobile display device, such as a smart phone, a mobile phone, a tablet PC, or a PDA, and may be a car navigation system, a TV, an outdoor signboard, a slot machine, an electronic whiteboard, or the like.

EXAMPLE

Hereinafter, the configuration and action of the present disclosure will be described in more detail by means of an exemplary embodiment. However, this is as an exemplary embodiment of the present disclosure, but may not be interpreted to limit the present disclosure in any meaningful way.

Contents which are not described herein may be sufficiently and technically deducted by those skilled in the art so that the description thereof will be omitted.

1. Prepare Specimen

Specimens according to a first exemplary embodiment, a second exemplary embodiment, a first comparative embodiment, and a second comparative embodiment with 10 cm in width and 10 cm in length in which a lower ITO having a thickness of 500 Å, an electroactive film having a thickness of 35 μm, and an upper ITO of 500 Å were laminated and were prepared with a composition described in Table 2.

In this case, the electroactive film was prepared by mixing PVDF-TrFE-CTFE and PMSEEA in a DMSO solvent, spin-coating the mixture on the lower ITO at 300 rpm for 15 seconds to form a coating film, hardening the coating film at a temperature of 70° C. for ten minutes, vacuum-drying the coating film at a temperature of 100° C. for fifteen minutes, and thermally processing the coating film at a temperature of 115° C. for thirty minutes, in this order.

TABLE 2

| Classification | Chemical component (Unit: weight %) | | |
|---|---|---|---|
| | Name of main material | Additive Name of material | Content |
| First comparative embodiment | PVDF-TrFE-CTFE | PESEMA | 7.0 |
| Second comparative embodiment | | | 7.1 |
| First exemplary embodiment | | | 7.3 |
| Second exemplary embodiment | | | 7.5 |

2. Evaluate Physical Property

Vibration accelerations of the electroactive film of the specimens according to the first exemplary embodiment, the second exemplary embodiment, the first comparative embodiment, and the second comparative embodiment at a frequency of 156 Hz at every voltage were measured to evaluate the vibration property. A measurement result was illustrated in FIG. 7.

Further, weight resistance was measured by applying a voltage of 400 V to the electroactive film of the specimens according to the first exemplary embodiment, the second exemplary embodiment, the first comparative embodiment, and the second comparative embodiment at a frequency of 156 Hz. A measurement result was illustrated in FIG. 8.

Further, modulus and light transmittance of the electroactive film of the specimens according to the first exemplary embodiment, the second exemplary embodiment, the first comparative embodiment, and the second comparative embodiment were measured. The measurement result was listed in the following Table 3.

Figure 7:
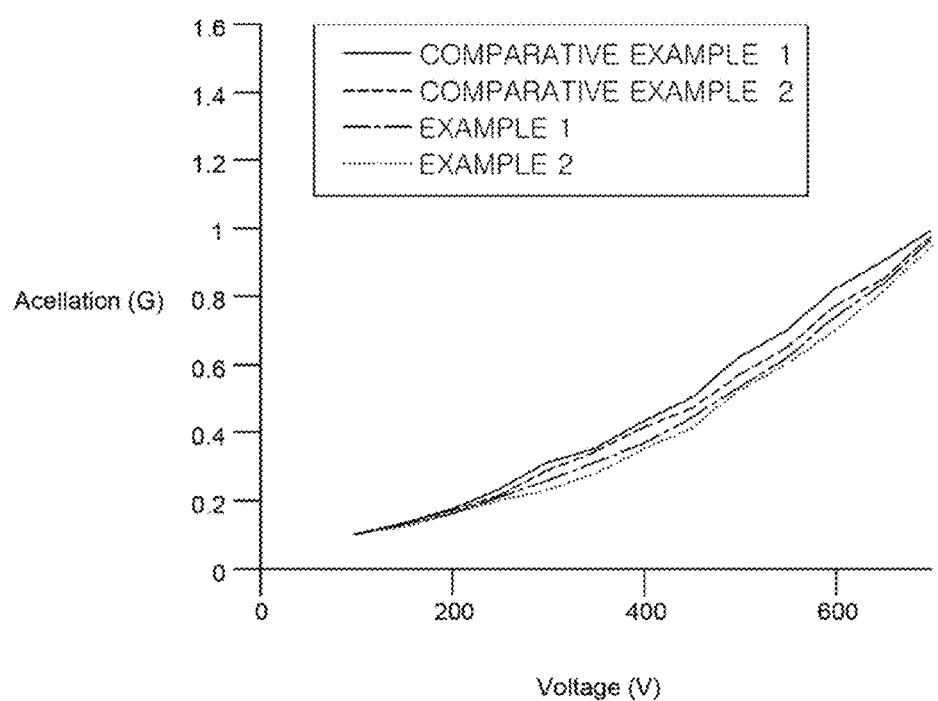
FIG. 7 is a graph illustrating a vibration acceleration characteristic of the electroactive film at every voltage according to a first exemplary embodiment, a second exemplary embodiment, a first comparative embodiment, and a second comparative embodiment of the present disclosure.
Figure 8:
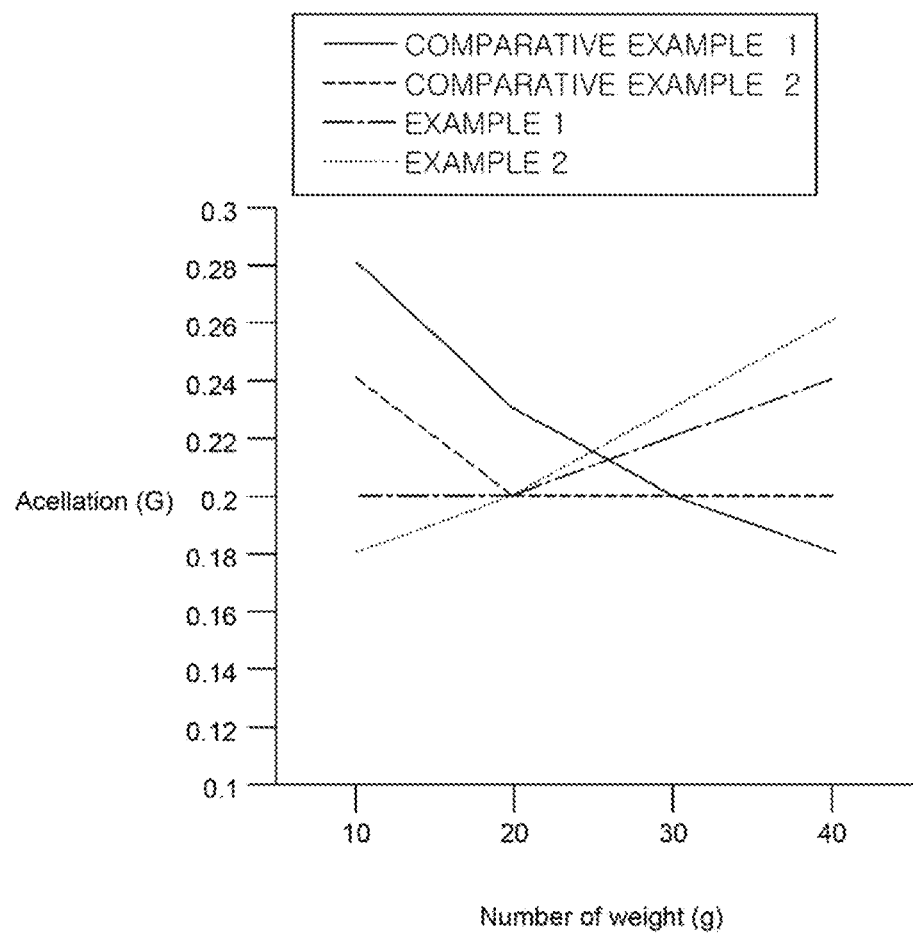
FIG. 8 is a graph illustrating a weight resistance characteristic of the electroactive film according to a first exemplary embodiment, a second exemplary embodiment, a first comparative embodiment, and a second comparative embodiment of the present disclosure.

FIG. 7 is a graph illustrating a vibration acceleration characteristic of the electroactive film at every voltage according to a first exemplary embodiment, a second exemplary embodiment, a first comparative embodiment, a second comparative embodiment of the present disclosure. FIG. 8 is a graph illustrating a weight resistance characteristic of the electroactive film according to a first exemplary embodiment, a second exemplary embodiment, a first comparative embodiment, and a second comparative embodiment of the present disclosure.

Referring to FIGS. 7 and 8, there was no significant difference between the vibration acceleration of the electroactive film of the first exemplary embodiment and the second exemplary embodiment. Also, there was no significant difference between the vibration acceleration of the electroactive film of the first comparative embodiment and the second comparative embodiment. However, the weight resistance was only improved in the electroactive film of the first exemplary embodiment and the second exemplary embodiment, which satisfies a target value of an additive described in the present disclosure.

TABLE 3

| Classification | Modulus (GPa) | Light transmittance (%, 550 nm) |
|---|---|---|
| First comparative embodiment | 0.69 | 76 |
| Second comparative embodiment | 0.69 | 75.9 |

TABLE 3-continued

| Classification | Modulus (GPa) | Light transmittance (%, 550 nm) |
|---|---|---|
| First exemplary embodiment | 0.7 | 75.5 |
| Second exemplary embodiment | 0.7 | 75.3 |

Referring to Table 3, both the electroactive film of the first exemplary and the second exemplary embodiment exhibit the following characteristics: the modulus is 0.7 GPa or higher at a frequency of 156 Hz and the light transmittance is 75% or higher.

Specifically, it was understood that the modulus of the electroactive film of the first exemplary embodiment and the second exemplary embodiment, which satisfied the target value of the additive suggested in the present disclosure, was improved without significantly lowering the light transmittance as compared with the first comparative embodiment and the second comparative embodiment, which did not satisfy the target value.

As shown by the above-experimental results, the electroactive film of the first exemplary embodiment and the second exemplary embodiment, which satisfy the condition described by the present disclosure, improve both the weight resistance and the modulus without significantly lowering the light transmittance, as compared with the first comparative embodiment and the second comparative embodiment, which do not satisfy the target value.

The exemplary embodiments of the present disclosure can also be described as follows:

According to an aspect of the present disclosure, a touch sensitive element includes an electroactive film which is formed of a fluorine based terpolymer and a polymer represented by the following Chemical Formula 1:

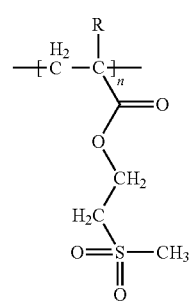

[Chemical Formula 1]

Figure 9:
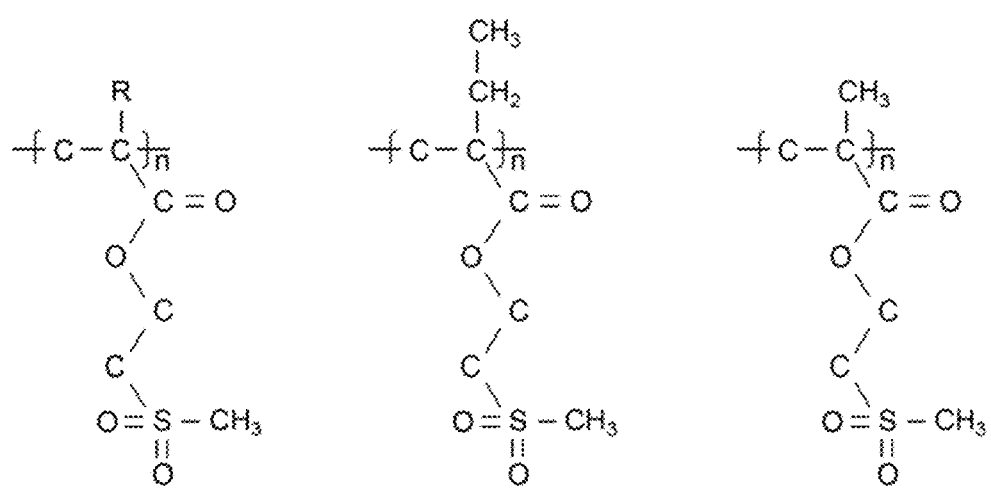
FIG. 9 are chemical structures representing Chemical formula 1 (left), Chemical formula 1 wherein R is an ethyl group (middle) and Chemical formula 1 wherein R is a methyl group (right).

In Chemical Formula 1, R is a methyl group or an ethyl group, and n is an integer of 1 or larger. FIG. 9 shows chemical structures representing Chemical Formula 1 (left), Chemical Formula 1 wherein R is an ethyl group (middle) and Chemical Formula 1 wherein R is a methyl group (right).

A sulfonyl group of the polymer represented by Chemical Formula 1 may have a dipole moment of 4.25 Debye.

An added amount of the polymer represented by Chemical Formula 1 may be 7.3 weight % to 10 weight % with respect to a total weight of the electroactive film.

A glass transition temperature Tg of the polymer represented by Chemical Formula 1 may be 185° C. to 195° C. and a polarization yield of the polymer represented by Chemical Formula 1 may be 57% to 67%.

A modulus of the electroactive film may be 0.6 GPa to 0.8 GPa at a frequency of 156 Hz and a weight resistance of the electroactive film may be 0.2 G to 0.6 G.

A permittivity of the electroactive film at a frequency of 156 Hz may be 5.0 to 9.0.

A light transmittance of the electroactive film may be 75% or higher.

The fluorine based terpolymer may be a poly vinylidene fluoride (PVDF) based terpolymer.

According to another aspect of the present disclosure, a touch sensitive element, includes: an electroactive film, which is formed of fluorine based terpolymer and acrylate based polymer having a sulfonyl group.

A modulus of the electroactive film at a frequency of 156 Hz may be 0.6 GPa to 0.8 GPa, and a weight resistance of the electroactive film may be 0.2 G to 0.6 G.

According to an aspect of the present disclosure, a display device includes a display panel, a touch panel, and a touch sensitive element. The touch sensitive element includes an electroactive film which is formed of a fluorine based terpolymer and a polymer represented by the following Chemical Formula 1:

[Chemical Formula 1]

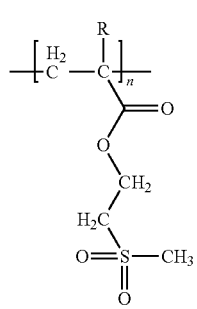

In Chemical Formula 1, R is a methyl group or an ethyl group and n is an integer of 1 or larger.

A modulus of the display device at a frequency of 156 Hz may be 0.6 GPa to 0.8 GPa, and a weight resistance of the display device may be 0.2 G to 0.6 G.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A touch sensitive element, comprising:
an electroactive film which is formed of a fluorine based terpolymer and a polymer represented by the following Chemical Formula 1:

[Chemical Formula 1]

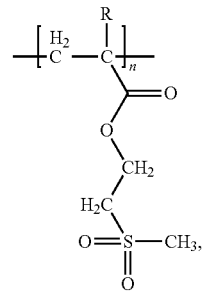

wherein R is a methyl group or an ethyl group, and n is an integer of 1 or larger.

2. The touch sensitive element according to claim 1, wherein the polymer has a sulfonyl group that has a dipole moment of 4.25 Debye.

3. The touch sensitive element according to claim 1, wherein the polymer is added in an amount of 7.3 weight % to 10 weight % with respect to a total weight of the electroactive film.

4. The touch sensitive element according to claim 1, wherein the polymer has a glass transition temperature (Tg) that is 185° C. to 195° C. and a polarization yield that is 57% to 67%.

5. The touch sensitive element according to claim 1, wherein the electroactive film has a modulus that is 0.6 GPa to 0.8 GPa at a frequency of 156 Hz and a weight resistance that is 0.2 G to 0.6 G.

6. The touch sensitive element according to claim 1, wherein the electroactive film has a permittivity at a frequency of 156 Hz that is 5.0 to 9.0.

7. The touch sensitive element according to claim 1, wherein the electroactive film has a light transmittance that is 75% or higher.

8. The touch sensitive element according to claim 1, wherein the fluorine based terpolymer is a poly vinylidene fluoride (PVDF) based terpolymer.

9. A touch sensitive element, comprising:
an electroactive film which is formed of a fluorine based terpolymer and an acrylate based polymer having a sulfonyl group.

10. The touch sensitive element according to claim 9, wherein the electroactive film has a modulus at a frequency of 156 Hz that is 0.6 GPa to 0.8 GPa and a weight resistance that is 0.2 G to 0.6 G.

11. A display device, comprising:
a display panel;
a touch panel; and
a touch sensitive element,
wherein the touch sensitive element includes an electroactive film which is formed of a fluorine based terpolymer and a polymer represented by the following Chemical Formula 1:

[Chemical Formula 1]

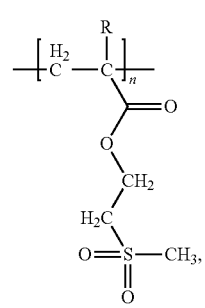

wherein R is a methyl group or an ethyl group, and n is an integer of 1 or larger.

12. The display device according to claim 11, wherein the display device has a modulus at a frequency of 156 Hz that is 0.6 GPa to 0.8 GPa and a weight resistance that is 0.2 G to 0.6 G.

13. The touch sensitive element according to claim 1, wherein the polymer represented by Chemical Formula 1 is polyethylsulfonylethylmetacrylate (PMSEEA) represented by the following Chemical Formula 2:

[Chemical Formula 2]

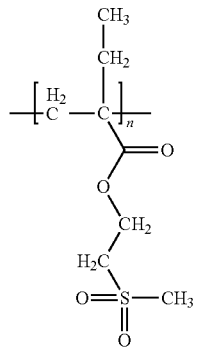

wherein, n is an integer of 1 or larger.

14. The touch sensitive element according to claim 1, wherein the polymer represented by Chemical Formula 1 is polymethylsulfonylethylmetacrylate (PMSEMA) represented by the following Chemical Formula 3:

[Chemical Formula 3]

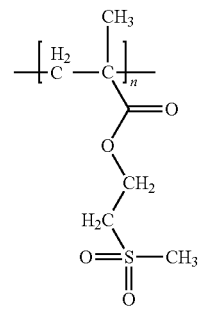

wherein n is an integer of 1 or larger.

15. The touch sensitive element according to claim 1, wherein the fluorine based terpolymer is polyvinylidene fluoride-trifluoroethylene-chlorotrifluoroethylene (PVDF-TrFE-CTFE).

16. The touch sensitive element according to claim 15, wherein the PVDF-TrFE-CTFE is in an amount of 7.3 to 7.5 wt %.

* * * * *